United States Patent
Dolezal et al.

(10) Patent No.: US 9,782,955 B2
(45) Date of Patent: Oct. 10, 2017

(54) TRANSFERABLE TRANSPARENT CONDUCTIVE PATTERNS AND DISPLAY STACK MATERIALS

(71) Applicant: 3M INNOVATIVE PROPERTIES COMPANY, St. Paul, MN (US)

(72) Inventors: Michael W. Dolezal, Stillwater, MN (US); Robert R. Kieschke, Woodbury, MN (US); Ta-Hua Yu, Woodbury, MN (US); Mark A. Roehrig, Stillwater, MN (US); Pradnya V. Nagarkar, Weston, MA (US); Matthew S. Stay, Minneapolis, MN (US); Shawn C. Dodds, St. Paul, MN (US); Bernard O. Geaghan, Salem, NH (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/912,125

(22) PCT Filed: Aug. 13, 2014

(86) PCT No.: PCT/US2014/050811
§ 371 (c)(1),
(2) Date: Feb. 15, 2016

(87) PCT Pub. No.: WO2015/047572
PCT Pub. Date: Apr. 2, 2015

(65) Prior Publication Data
US 2016/0200086 A1 Jul. 14, 2016

Related U.S. Application Data

(60) Provisional application No. 61/881,789, filed on Sep. 24, 2013, provisional application No. 61/907,367, filed on Nov. 21, 2013.

(51) Int. Cl.
*B32B 3/00* (2006.01)
*B32B 7/14* (2006.01)
(Continued)

(52) U.S. Cl.
CPC ............... *B32B 7/14* (2013.01); *B32B 7/02* (2013.01); *B32B 37/12* (2013.01); *G01L 1/146* (2013.01);
(Continued)

(58) Field of Classification Search
CPC B32B 7/12; B32B 37/12; B32B 38/10; B32B 2457/208; H05K 3/007;
(Continued)

(56) References Cited

U.S. PATENT DOCUMENTS

| 4,516,112 A | 5/1985 | Chen |
| 4,696,719 A | 9/1987 | Bischoff |

(Continued)

FOREIGN PATENT DOCUMENTS

| CN | 102207784 | 10/2011 |
| WO | WO 00-26973 | 5/2000 |

(Continued)

OTHER PUBLICATIONS

International Search Report for PCT International Application No. PCT/US2014/050811 mailed on Dec. 2, 2014, 3 pages.

*Primary Examiner* — Elizabeth Mulvaney
(74) *Attorney, Agent, or Firm* — Clifton F. Richardson

(57) ABSTRACT

Touch sensor layer constructions and methods of making such constructions are described. More particularly, touch sensor constructions that utilize patterned conductive layers that may be applied by a sacrificial release liner, eliminating (Continued)

one or more glass and/or film substrate from touch sensor stacks, and methods of making such constructions are described.

20 Claims, 7 Drawing Sheets

(51) Int. Cl.
*B32B 7/02* (2006.01)
*B32B 37/12* (2006.01)
*G01L 1/14* (2006.01)
*G06F 3/047* (2006.01)
*G01L 1/20* (2006.01)
*G01L 1/22* (2006.01)
*H05K 3/00* (2006.01)
*B32B 38/10* (2006.01)

(52) U.S. Cl.
CPC ............ *G01L 1/205* (2013.01); *G01L 1/2287* (2013.01); *G06F 3/047* (2013.01); *H05K 3/007* (2013.01); *B32B 38/10* (2013.01); *B32B 2457/208* (2013.01); *H05K 2201/0108* (2013.01); *H05K 2201/10128* (2013.01)

(58) Field of Classification Search
CPC ..... H05K 2201/026; H05K 2201/0108; H05K 2201/10128; G06F 3/047
See application file for complete search history.

(56) References Cited

U.S. PATENT DOCUMENTS

| | | |
|---|---|---|
| 4,722,515 A | 2/1988 | Ham |
| 4,842,893 A | 6/1989 | Yializis |
| 4,895,630 A | 1/1990 | Aufderheide |
| 4,954,371 A | 9/1990 | Yializis |
| 5,018,048 A | 5/1991 | Shaw |
| 5,032,461 A | 7/1991 | Shaw |
| 5,097,800 A | 3/1992 | Shaw |
| 5,125,138 A | 6/1992 | Shaw |
| 5,440,446 A | 8/1995 | Shaw |
| 5,541,372 A | 7/1996 | Baller |
| 5,547,908 A | 8/1996 | Furuzawa |
| 5,877,895 A | 3/1999 | Shaw |
| 6,010,751 A | 1/2000 | Shaw |
| 6,045,864 A | 4/2000 | Lyons |
| 6,214,422 B1 | 4/2001 | Yializis |
| 6,231,939 B1 | 5/2001 | Shaw |
| 7,018,713 B2 | 3/2006 | Padiyath |
| 7,148,882 B2 | 12/2006 | Kamrath |
| 7,538,760 B2 | 5/2009 | Hotelling |
| 2009/0030084 A1 | 1/2009 | Kurosu |
| 2009/0087629 A1 | 4/2009 | Everaerts |
| 2009/0237374 A1 | 9/2009 | Li |
| 2009/0309616 A1 | 12/2009 | Klinghult |
| 2010/0028564 A1 | 2/2010 | Cheng |
| 2010/0040842 A1 | 2/2010 | Everaerts |
| 2010/0139955 A1 | 6/2010 | Long |
| 2011/0126968 A1 | 6/2011 | Determan |
| 2011/0139516 A1 | 6/2011 | Nirmal |
| 2011/0244218 A1 | 10/2011 | Suzuki |
| 2011/0253301 A1 | 10/2011 | Yamanaka |
| 2012/0094090 A1 | 4/2012 | Yamazaki |
| 2012/0103660 A1 | 5/2012 | Gupta |
| 2012/0154811 A1 | 6/2012 | Pokorny |
| 2012/0194481 A1 | 8/2012 | Frey |
| 2013/0004749 A1 | 1/2013 | Hao |
| 2013/0040123 A1 | 2/2013 | Cho |
| 2013/0129465 A1 | 5/2013 | Okazaki |
| 2014/0251662 A1* | 9/2014 | Rotto .................. C09J 9/02 174/253 |

FOREIGN PATENT DOCUMENTS

| | | |
|---|---|---|
| WO | WO 2008-128073 | 10/2008 |
| WO | WO 2010-018734 | 2/2010 |
| WO | WO 2011-156447 | 12/2011 |
| WO | WO 2013-025330 | 2/2013 |
| WO | WO 2013-191939 | 12/2013 |
| WO | WO 2015-077018 | 5/2015 |
| WO | WO 2015-077200 | 5/2015 |

* cited by examiner

TRANSFERABLE TRANSPARENT CONDUCTIVE PATTERNS AND DISPLAY STACK MATERIALS

FIELD

The present description relates to touch sensor layer constructions and methods of making such constructions. More particularly, the present description relates to touch sensor constructions that utilize patterned conductive layers that may be applied by a sacrificial release liner, eliminating one or more glass and/or film substrate from touch sensor stacks, and methods of making such constructions.

BACKGROUND

Positional Touch screen sensors detect the location of an object (e.g. a finger or a stylus) applied to the surface of a touch screen display or the location of an object positioned near the surface of a touch screen display. These sensors detect the location of the object along the surface of the display, e.g. in the plane of a flat rectangular display. Examples of positional touch screen sensors include capacitive sensors, resistive sensors, and projected capacitive sensors. Such sensors include transparent conductive elements that overlay the display. The conductive elements can be combined with electronic components that can use electrical signals to probe the conductive elements in order to determine the location of an object near or in contact with the display.

In addition to positional sensing, it is often useful for user input devices (e.g., computer user input devices) such as touch screen displays to measure the magnitude of force associated with a touch event. A number of designs and constructions for touch screen display sensors that include force measurement have been described previously. Designs and constructions for touch screen display sensors that include force measurement include examples based on strain gauges such as is disclosed in U.S. Pat. No. 5,541,371 (Baller et al.); examples based on capacitance change between conductive traces or electrodes residing on different layers within the sensor, separated by a dielectric material or a dielectric structure comprising a material and air such as is disclosed in U.S. Pat. No. 7,148,882 (Kamrath et al.) and U.S. Pat. No. 7,538,760 (Hotelling et al.); examples based on resistance change between conductive traces residing on different layers within the sensor, separated by a piezoresistive composite material such as is disclosed in U.S. Pat. Publ. No. 2009/0237374 (Li et al.); and examples based on polarization development between conductive traces residing on different layers within the sensor, separated by a piezoelectric material such as is disclosed in U.S. Pat. Publ. No. 2009/0309616 (Klinghult et al.). Most such touch screen display sensors that measure the force of touch are limited by certain deficiencies. Those deficiencies include a propensity for transparent conductive elements (e.g., elements based on indium tin oxide) to crack when strained, conspicuous sensing elements that are unsuitable for interposing between a device user and an information display since they can substantially obscure the viewability of the display, and bulky force measurement components that can lead to undesirable device or bezel thickness or other large device dimensions.

In addition to conspicuous sensing elements that can substantially obscure the viewability of a display, greater thickness in the stack, particularly in the cover glass or film, may result in a reduced sensitivity of the touch sensor. Each of these problems are compounded or perpetuated in part because transparent conductive elements as well as supporting electronic structures, such as conductive metal interconnects, have been deposited or patterned onto films and/or glass substrates which ultimately become part of the final touch sensor optical stack.

SUMMARY

In one aspect, the present description relates to a construction that includes a first patterned conductive layer, an optically clear adhesive and a protective layer. The patterned conductive layer includes rows of conductor extending in a first direction, and is capable of being transferred from a sacrificial release liner. The optically clear adhesive is positioned on the patterned conductive layer. The protective layer is positioned on the opposite side of the first patterned conductive layer from the optically clear adhesive.

In another aspect, the present description relates to a construction that includes a first patterned conductive layer, an optically clear adhesive, and a second patterned conductive layer. The first patterned conductive layer includes rows of conductor extending in a first direction, and is capable of being transferred from a sacrificial release liner. The optically clear adhesive is positioned on the first patterned conductive layer. The second patterned conductive layer is positioned on the opposite side of the optically clear adhesive from the first patterned conductive layer. The second patterned conductive layer includes rows of conductor extending in a second direction that is orthogonal to the first direction but in a parallel plane as the first direction. Additionally, the second conductive layer is capable of being transferred to the optically clear adhesive by a sacrificial release liner.

In yet another aspect, the present description relates to a method. The method includes the steps of providing a release liner, coating a protective layer on the release liner, coating a conductive layer onto the protective layer, patterning the conductive layer, removing the release liner, and laminating the protective layer and patterned conductive layer to an optically clear adhesive. The method may be performed sequentially. In at least one aspect, the method may further include providing a second release liner, coating a second conductive layer onto the release liner, patterning the second conductive layer, laminating the second conductive layer to the opposite side of the optically clear adhesive from the conductive layer, and removing the second release liner.

In another aspect, the present description relates to a touch sensor. The touch sensor included first and second patterned conductive layers. Each patterned conductive layer is capable of being transferred from a sacrificial release liner. The touch sensor also includes an optically clear layer disposed between and adhered to the first and second patterned conductive layers. The touch sensor is configured to determine a location of a force applied to the touch sensor and at least one of a magnitude and a direction of the applied force.

DETAILED DESCRIPTION

Figure 1:
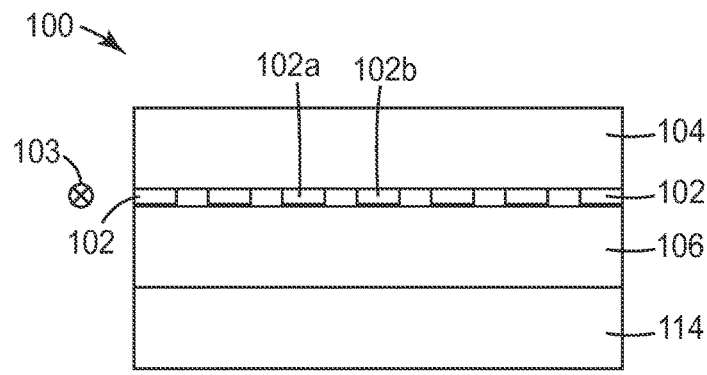
FIG. 1 is a cross-sectional view of a touch sensor construction according to the present description.

Conspicuous sensing elements that can substantially obscure the viewability of a display, and thick sensor stacks resulting in reduced touch sensitivity and reduction in quality of the image through the touch sensor are each existing problems created by the current inclusion of films and/or glass substrates in the touch sensor stack upon which transparent conductors are deposited and/or patterned. The present description provides a solution to these problems and a number of others by eliminating the necessity of inclusion of the film and/or glass substrate upon which the transparent conductor is patterned, from the touch sensor stack. The ability to transfer a conductive pattern from a secondary, sacrificial and releasable substrate provides a number of benefits over the previously utilized constructions in the field. First, it allows for thinner total constructions. Second, it eliminates the difficulties of employing substrates (such as cyclic olefin polymer) in operations, such as sputter coating, in which the substrate is a fundamental limitation of process flexibility and yield. Third, it provides a path to lower cost constructions by eliminating the necessity of optically pristine substrates (i.e. the film and/or glass substrate alluded to above). Fourth, it reduces overall weight of the final construction. Fifth, and perhaps most important, it improves electrical function of the touch sensor by moving the top conductive electrode closer to the user by eliminating of the cover glass or film substrate. Sixth, it improves optical properties such as increased transmission, lowering haze, and eliminating birefringence which are all impacted by the inclusion of one or more layers of glass or polymer substrates, such as PET. Seventh, elimination of the glass and/or polymer film substrate provides for greater sensitivity for force sensitive touch constructions by eliminating layers which inherently dissipate the force of the touch by spreading the force substantially laterally from the primary incident touch direction. Articles utilizing this improved construction and methods of making this improved construction are provided herein.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

A first construction contemplated according to the present description is illustrated in FIG. 1. Construction 100 includes a first patterned conductive layer 102 including rows (e.g. 102a, 102b) of conductor that extend in a first direction 103. In the construction of FIG. 1, the first direction 103 is depicted schematically to show it going into the page on which the drawing is illustrated. First patterned conductive layer 102 is capable of being transferred from (as well as patterned on) a sacrificial release liner. As used herein, "sacrificial" means generally that the release liner will not remain with the final construction 100. This concept is further discussed in the method discussion further below. Additionally, where it is noted that a conductive layer is "capable of being transferred from" a release liner it should be understood that in many embodiments the conductive will actually have been transferred from a release liner. The sacrificial release liner could be positioned either above or below the patterned conductive layer 102 before application, and may be positioned, for example, on the top of protective layer 104, or potentially directly on conductive layer 102. Construction 100 further includes an optically clear adhesive 106 that is positioned on the patterned conductive layer.

Optically clear adhesive 106 may be any suitable optical adhesive used in the industry in touch screen applications. For example, optically clear adhesive layer 106 may be 3M No. 2506, an acrylic adhesive available from 3M Company, St. Paul, Minn. Alternatively, optically clear adhesive 106 may an adhesive in liquid form.

The optically clear adhesives that may be used in the present disclosure are those that exhibit an optical transmission of at least about 90%, or even higher, and a haze value of below about 5% or even lower. Suitable optically clear adhesives may have antistatic properties, may be compatible with corrosion sensitive layers, and may be able to be released from the glass substrate by stretching the adhesive. Illustrative optically clear adhesives include those described in publications WO 2008/128073 relating to antistatic optically clear pressure sensitive adhesive, U.S. Patent Application Publication U.S. 2009/030084 A1 relating to stretch releasing optically clear adhesive, U.S. 2009/0087629 relating to indium tin oxide compatible optically clear adhesive; U.S. Patent Publication Nos. 2010/0028564 relating to antistatic optical constructions having optically transmissive adhesive, and 2010/0040842 relating to adhesives compatible with corrosion sensitive layers; and U.S. Patent Publication Nos. 2011/0126968 relating to optically clear stretch release adhesive tape, and 2011/0253301 stretch release adhesive tape. In one embodiment, the optically clear adhesive has a thickness of about 5 mm or less.

In alternative constructions, rather than using a traditional optically clear adhesive, one may consider using a contrast enhancement film, such as 3M Product No. CEF2804, 2806, 2807, 2808 and 2810 available from 3M Company (St. Paul, Minn.). Contrast Enhancement Film (CEF) is specialized optically clear adhesive offering superior clarity and excellent adhesion to various transparent display substrates. It is recommended for applications that require soft CEF for filling thick ink step (lens border frame), ITO compatibility and high adhesion. Contrast Enhancement Film is post UV curable which makes it suitable for film touch panel and liquid crystal module bonding applications. Alternatively, in applications where touch sensors do not require transmissivity (e.g. a smart board with a projection screen that may utilize a remote sensor, or potentially reflective displays such as those in e-readers), the adhesive utilized need not be optically clear.

On the opposite side of the first patterned conductive layer 102 from the optically clear adhesive, a protective layer 104 is positioned. Protective layer 104 will generally be highly transparent and highly durable. In some embodiments, the protective layer may be a hardcoat that exhibit glass-like properties, and include alkoxylated multi (meth)acrylate monomers, such as the hardcoat described in commonly owned and assigned U.S. Patent Publication No. 2012-0154811, the content of which is hereby incorporated by reference in its entirety. Hardcoat (or other protective layer) will often be a non-glass material and may include inorganic nanoparticles with an average particle size less than 200 nm. Additional useful hardcoats include siloxane, silazane, sol-gel, and ORMOCER®. It may be desirable that the hardcoat be deformable for, e.g., the purposes of enablement of force sensing. In other embodiments, rather than a hardcoat, the protective layer may be glass, such as the cover glass of a device. Additionally, the protective layer can be the Contrast Enhancement Film from 3M described above, or a polyurethane, or other appropriate polymers, for example. Protective layer may have a thickness of between 0.25 microns to 10 microns, preferably between 0.5 microns to 5 microns, and more preferably between 1 micron and 4 microns.

Additionally, although the first patterned conductive layer is capable of being carried by and transferred from the release liner, the release liner itself may actually be attached to the patterned transparent conductive layer 102 by way of the protective layer 104, such that the release liner is attached to the top surface of protective layer 104. In alternative embodiments, the release liner may be attached directly to the conductive layer 102.

Figure 2:
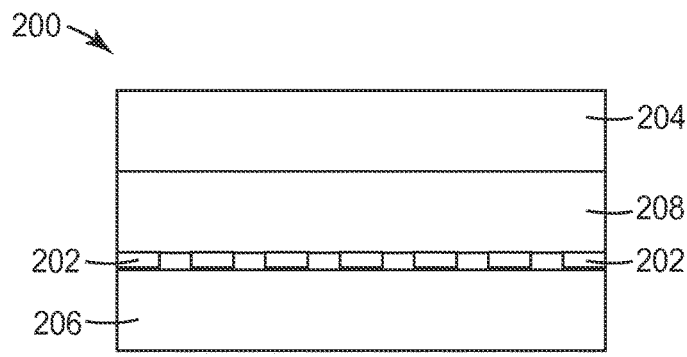
FIG. 2 is a cross-sectional view of a touch sensor construction according to the present description.

FIG. 2 illustrates another construction according to the present description. Touch sensor stack construction 200 includes a first patterned conductive layer 202 positioned generally between an optically clear adhesive 206 and a protective layer 204. However, in this particular embodiment, the construction further includes a barrier layer 208 that is positioned between the protective layer 204 and the first transparent conductive layer 202. Barrier layer 208 may include any number of appropriate layers that act as moisture barriers and offer desired light transmission properties, for example barrier layers made by plasma enhanced chemical vapor deposition, atomic layer deposition, sputtering, or evaporation processes. A preferred example of such transparent barrier layers is the multilayer barrier and processes for making such layers found, for example, in U.S. Pat. No. 5,440,446 (Shaw et al.); U.S. Pat. No. 5,877,895 (Shaw et al.); U.S. Pat. No. 6,010,751 (Shaw et al.); and U.S. Pat. No. 7,018,713 (Padiyath et al.). In at least some embodiment, where the barrier layer is multiple barrier layers (or a barrier layer stack), there may be a base polymer layer in the stack. Most preferably, the base polymer layer is formed by flash evaporation and vapor deposition followed by cross linking in situ, e.g., as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); and in PCT International Publication No. WO 00/26973 (Delta V Technologies, Inc.). The barrier layer can be fabricated by deposition of the layer onto the protective layer, in a roll-to-roll vacuum chamber similar to the system described in U.S. Pat. No. 5,440,446 (Shaw et al.) and U.S. Pat. No. 7,018,713 (Padiyath, et al.).

Figure 3:
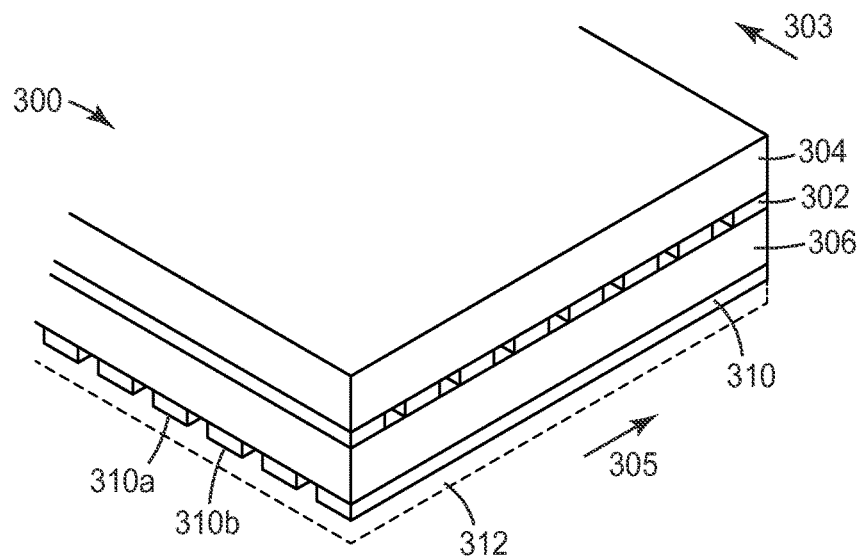
FIG. 3 is a perspective view of a touch sensor construction according to the present description.

Yet another embodiment is illustrated in FIG. 3. Construction 300 includes a first patterned conductive layer 302 with rows of conductor extending in first direction 303. The patterned conductive layer is capable of being transferred from a sacrificial release liner that attaches either directly to the conductive layer or a layer that is bonded (potentially through multiple layers) the conductive layer. Construction 300 further includes optically clear adhesive 306 and protective layer 304. Additionally, in construction 300, a second patterned conductive layer 310 is present. Second patterned conductive layer 310 includes rows (310a, 310b) of conductor extending in a second direction 305 that is orthogonal to the first direction 303, but in a parallel plane to the first direction.

In at least one embodiment, the conductor 310 may also be partially or fully embedded in a second protective layer 312 that may act to protect the second conductor and potentially offer a substrate on which another releasable sacrificial substrate can be attached. Second protective layer 312 may be any of the materials or possess ay of the qualities of first protective layer described above.

Where protective layer 304 is a non-glass substrate, such as a hardcoat or polyurethane, it may provide both thinness and flexibility not present in glass. Accordingly, when force is applied in the direction orthogonal to the plane created by directions 303 and 305 (i.e. down onto the surface of layer 304), it may be possible to sense a touch with far less force applied.

Additionally, as noted previously, elimination of the glass and/or polymer film substrate provides for greater sensitivity for force sensitive constructions. The present construction can enable force sensitive constructions, such that the magnitude and direction of a touch event can be determined and processed. This is so at least in part because the first and/or second patterned conductive layers as well as the optically clear adhesive layers in the formulations described may each individually be, or may all be, flexible or deformable materials. In some cases optically clear adhesive 306 may include not only adhesive but other elements, such that it may be more widely described as an optically clear "layer" 306. Optically clear layer may be one or a number of different deformable materials. In at least one embodiment the optically clear layer is in fact a homogeneous layer or a layer with a number of sublayers. In either case, the optically clear layer may contain polyvinylidene fluoride (PVDF) or other appropriate piezoelectric materials. In some embodiments, optically clear layer will be anisotropic. In certain embodiments, where multiple sublayers are present in optically clear layer 306, each sublayer may provide necessary functionality. For example, certain sublayers may provide stiffness while others exhibit desirable electrical properties.

In one embodiment, the construction 300 of FIG. 3 may be part of a touch sensor that is configured to determine a location of a force applied to the touch sensor. The touch sensor may further be configured to determine a magnitude of force applied. Additionally, the touch sensor may be configured to determine the direction of the applied force. In some cases, the touch sensor may be configured to determine location of a force and one of the magnitude and direction of the applied force. In others, the touch sensor may be configured to determine location of a force and both of the magnitude and direction of the applied force. The location of the applied force may be determined by a change in a capacitive coupling between the first patterned conductive layer 302 and second patterned conductive layer 310. At least one (or potentially both) of the magnitude and the direction of the applied force may be determined by a deformation of the optically clear layer. Additional concepts related to sensing touch location and/or touch magnitude using poled piezoelectric films are described in commonly owned U.S. Patent Application Ser. No. 61/907,354, filed on Nov. 21, 2013, and which is incorporated herein by reference in its entirety.

In another sense, a touch sensor incorporating construction 300 may be configured to determine a direction and potentially the magnitude of a force applied to the touch sensor by determining an anisotropic change in a given characteristic of the applied force. This characteristic may be the contact area between the touch sensor and the applied force, or potentially a capacitive coupling between the touch sensor and the applied force. In some embodiments, when the force is applied to the touch sensor along an oblique direction, the contact area may change anisotropically along the oblique direction projected onto the touch sensor. In other embodiments, when the force is applied to the touch sensor along an oblique direction, the capacitive coupling increases along the oblique direction projected onto the touch sensor. The touch sensor may further be configured to determine direction of a force by determining an anisotropic change in a characteristic of the optically clear layer. Additional concepts related to determining the direction of a touch applied to a touch surface are described in commonly owned U.S. Patent Application Ser. No. 61/907,360, filed on Nov. 21, 2013, and which is incorporated herein by reference in its entirety.

Figure 4:
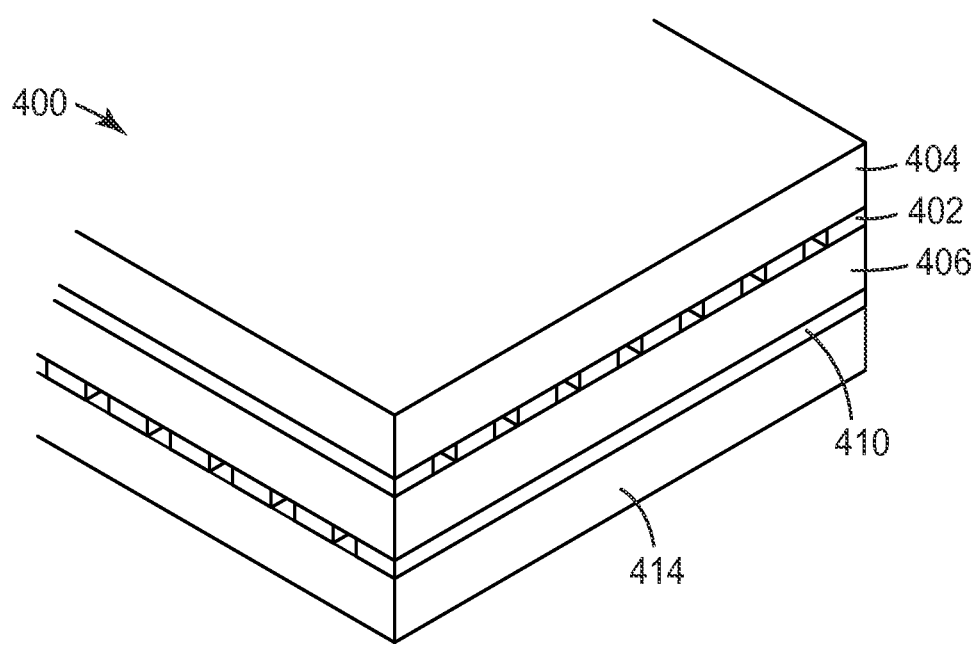
FIG. 4 is a perspective view of a touch sensor construction according to the present description.

Alternatively, as illustrated in FIG. 4, in construction 400, there may be a second protective layer 414 upon which a second patterned conductive layer 410 is disposed. This construction includes an optically clear adhesive 406 disposed on one side of second conductive layer, a first conductive layer 402, disposed on the opposite side of adhesive 406 from the second conductive layer, in which the patterned conductor rows extend orthogonal to the conductor rows of layer 410, and a first protective layer 404 on the opposing end of the stack. In yet another embodiment, rather than a second protective layer 414, second patterned conductive layer 410 may be deposited or transferred onto a polarizer, such as a cellulose triacetate (TAC) polarizer, for example, or other multilayer polymeric polarizing films such as those available from 3M Company. Alternatively, the polarizer could be a glass polarizer.

Returning to FIG. 1, optionally, a glass receptor substrate 114 may be positioned on the opposite side of the optically clear adhesive 106 from the first patterned conductive layer 102, such that the optically clear adhesive is adhered to the surface of glass receptor substrate 114. Glass receptor substrate may be the front surface for a touch screen device, color filter glass, LCD, or the like. Additionally, layer 104, in some embodiments, rather than being a non-glass protective layer, may in fact be the cover glass of a device.

First patterned conductor layer 102, 202, 302, etc. and second patterned conductor layer 310, 410 may be any number of appropriate conductors. Generally, as the conductors are utilized in touch screen applications, the conductors will be transparent or at least fine featured, such that the conductor does not interfere substantially with viewing of the device. Preferably, the conductors are of dimensions such that they are substantially undetectable to a user's eye or the user is not capable of resolving or only nominally capable of resolving the conductor pattern. In one embodiment, the patterned conductive layer or layers may be a patterned oxide layer such as an indium tin oxide conductor. In another embodiment, the patterned conductive layer or layers may be a silver nanowire conductor. Alternatively, the patterned conductive layer may be a metal mesh conductor or may be carbon nanotubes or graphene or may be a combination of said conductors. As will be appreciated from the discussion below, each of these conductors may utilize different steps to apply and pattern the conductive layer on the adjacent layer to which it is positioned.

Figure 10A:
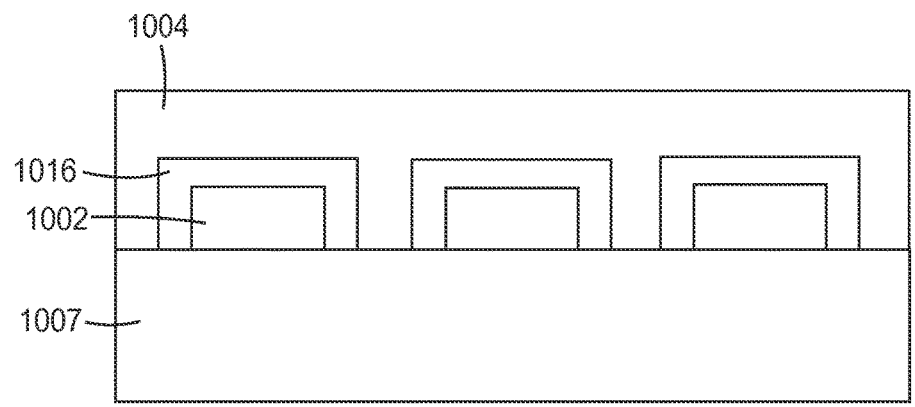
FIGS. 10a-b are cross-sectional and perspective views, respectively, of a portion of a construction according to the present description.
Figure 10B:
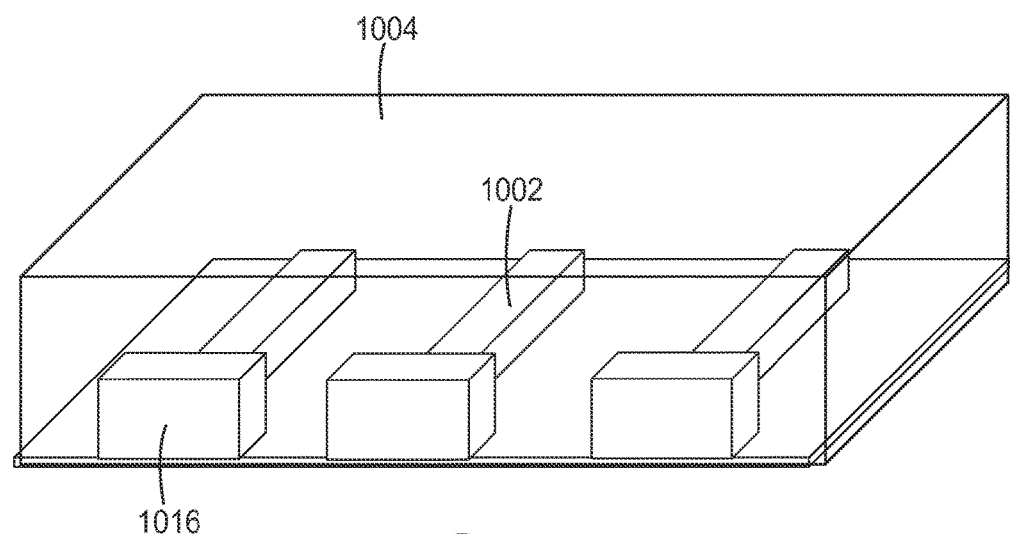

Constructions according to the present description may further include interconnects that connect to the first patterned conductive layer and/or second patterned conductive layer (where one is present). Interconnects may be any number of materials, including but not limited to aluminum, copper, silver, gold, palladium, carbon, or nickel alloys. FIGS. 10a and 10b illustrate a configuration of interconnects as it relates to other elements in the present constructions. Here, first patterned conductive layer 1002 is positioned on a first substrate 1007. The first substrate could be a sacrificial release layer or another layer, such as the protective layers described herein. At the end of each row of conductor an interconnect 1016 is disposed. Optically clear adhesive 1004 coats and surrounds the first conductive layer and interconnects.

As noted above, one of the primary advantages of the various present constructions, and particularly the ability to pattern and apply conductive layers on sacrificial release liners is the thinness of the final constructions. In fact, in any of the constructions illustrated, the thickness of the construction is less than 200 microns, preferably less than 175 microns, or less than 150 microns, or less than 100 microns.

Figure 5:
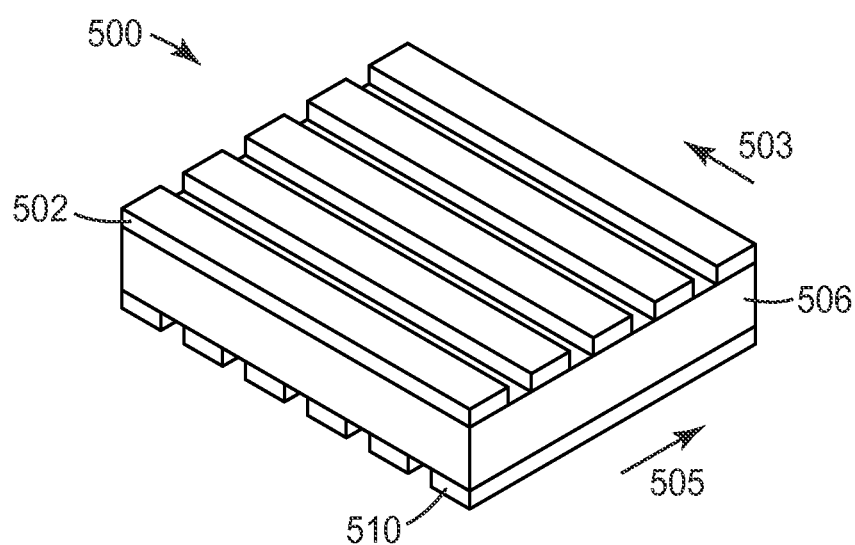
FIG. 5 is perspective view of a touch sensor construction according to the present description.

FIG. 5 illustrates one further embodiment of a construction for use in a touch assembly according to the present description. Construction 500 includes a first patterned conductive layer 502 that includes rows of conductor extending in a first direction 503. The first patterned conductive layer is capable of being transferred to the adjacent layer by a sacrificial release liner. The conductive layer may also be patterned on the sacrificial release liner. Positioned immediately adjacent the first patterned conductive layer 502 is an optically clear adhesive 506, such that the layer 506 adheres to the conductive layer 502 (generally by lamination). Second patterned conductive layer 510 is positioned on the opposite side of optically clear adhesive 506 from the first patterned conductive layer 502. Second patterned conductive layer 510 includes rows (or columns) of conductor extending in a second direction 505 that is generally orthogonal to the first direction 503, but in a substantially parallel plane to the first direction. The second patterned conductive layer is capable of being transferred to the optically clear adhesive by a sacrificial release liner. As with the first conductive layer, it may also be patterned, or printed on the sacrificial release liner. The properties of the elements disclosed in this particular embodiment may share those of similar name in the previously described embodiments.

Figure 6:
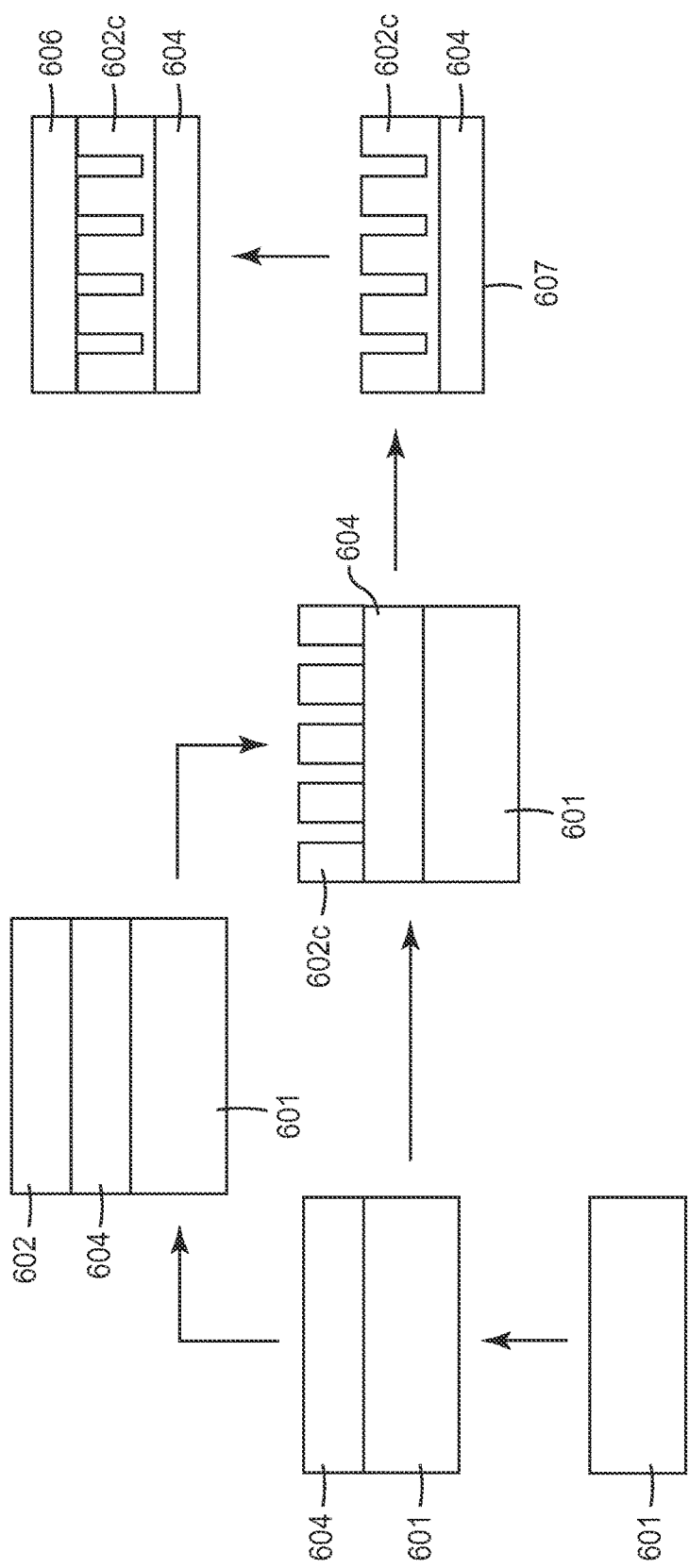
FIG. 6 is a flow chart of a method according to the present description.

In another sense, the present description relates to a method for making a construction for use in a touch sensor stack. FIG. 6 provides a flow chart of one method according to the present description. The method includes providing a release liner 601. A protective layer 604 is coated onto the release liner. The protective layer may be coated onto the release liner using any appropriate method. In at least one embodiment, the protective layer is applied to the release liner using a wet coating process. The method further involves coating a conductive layer 602 onto the protective layer 604 on the opposite side of the protective layer from the release liner. Conductive layer 602 may be coated onto the protective layer using any appropriate process known to one of skill in the art. One particular process that may be utilized to coat the conductive layer 602 onto the protective layer is a vacuum coating process.

The method illustrated in FIG. 6 further includes the step of patterning the conductive layer 602. In this particular figure, the patterned conductive layer is labeled as element 602c. The conductive layer may be patterned through a number of different appropriate methods depending on the conductor material utilized. For example, as noted above, in one embodiment the conductive layer (or layer) is indium tin oxide. Where indium tin oxide is used, one method of patterning the conductive layer 602 may be using an etching process. For example, one may coat a layer of photoresist on layer 602, expose the photoresist through a mask containing open areas in a desired pattern in which UV light is allowed to reach the photoresist and cure the resist in place to make, for example, rows of cured resist patterns in a first direction and uncured areas of photoresist in between. The layer 602 with cured and un-cured photoresist may then be exposed to solutions containing oxalic acid to remove uncured photoresist and indium tin oxide leaving rows of indium tin oxide conductor yielding the desired construction.

Indium tin oxide and a multilayer conductor containing indium tin oxide and a dielectric layer (as described in U.S. Patent Publication No. 2011/0139516) can alternatively be patterned by laser etching or other known methods in the art (as described in U.S. Pat. No. 4,895,630). Alternatively, the conductive layer may be made up of silver. In such a case, the silver may be patterned using a micropatterning process as described in US Patent Publication No. 2012/0194481. As with the constructions described above, the conductive layer may also be a metal mesh, carbon nanotubes or graphene. Appropriate patterning techniques for these materials is disclosed in US Patent Publication No. 2012/0194481 and International Patent Application No. PCT/US2013/044921. Where both a first and second patterned conductive layer are present, the layers may be of similar conductive layer materials or may be different materials.

The method illustrated in FIG. 6 includes the further step of removing the release liner 601, and laminating the protective layer and patterned conductive layer to an optically clear adhesive layer 606. The release liner 601 may generally be removed from the protective layer by peeling the release liner from the protective layer whereby the release force necessary to separate the liner from the protective layer is less than the attractive force exerted by the newly attached optically clear adhesive. The steps of the method illustrated in FIG. 6 may be performed sequentially in the order described and illustrated. Alternatively, the steps may, where appropriate, be performed in a different order. For example, the protective layer and patterned conductive layer may be laminated to the optically clear adhesive before the release liner is removed.

Where the protective layer will ultimately be the surface most proximate the user of a touch sensor system (i.e. the outermost layer), antireflective properties may be highly desirable. Again referring to FIG. 6, another step may be performed in the method illustrated that is not shown in order to provide such qualities. An antireflective coating or film may be positioned on the surface of the protective layer 604 that is opposite the patterned conductor 602 (i.e. surface 607). Alternatively, the surface 607 may be etched to create antireflective properties. Any number of anti-reflective coatings or films may be appropriate for this particular usage. For example, useful antireflective coatings or films may multilayer antireflective coatings, films or coatings with antireflective nanostructures created by curing of coatings that include inorganic nanoparticles in the presence of oxygen, or films and/or coatings with embedded micro and/or nanoparticles. Where the surface 607 is etched, a chemical etching process, reactive-ion etching process or physical etching process may provide intermittent patterning on the surface to provide the anti-reflective properties desired.

Figure 7:
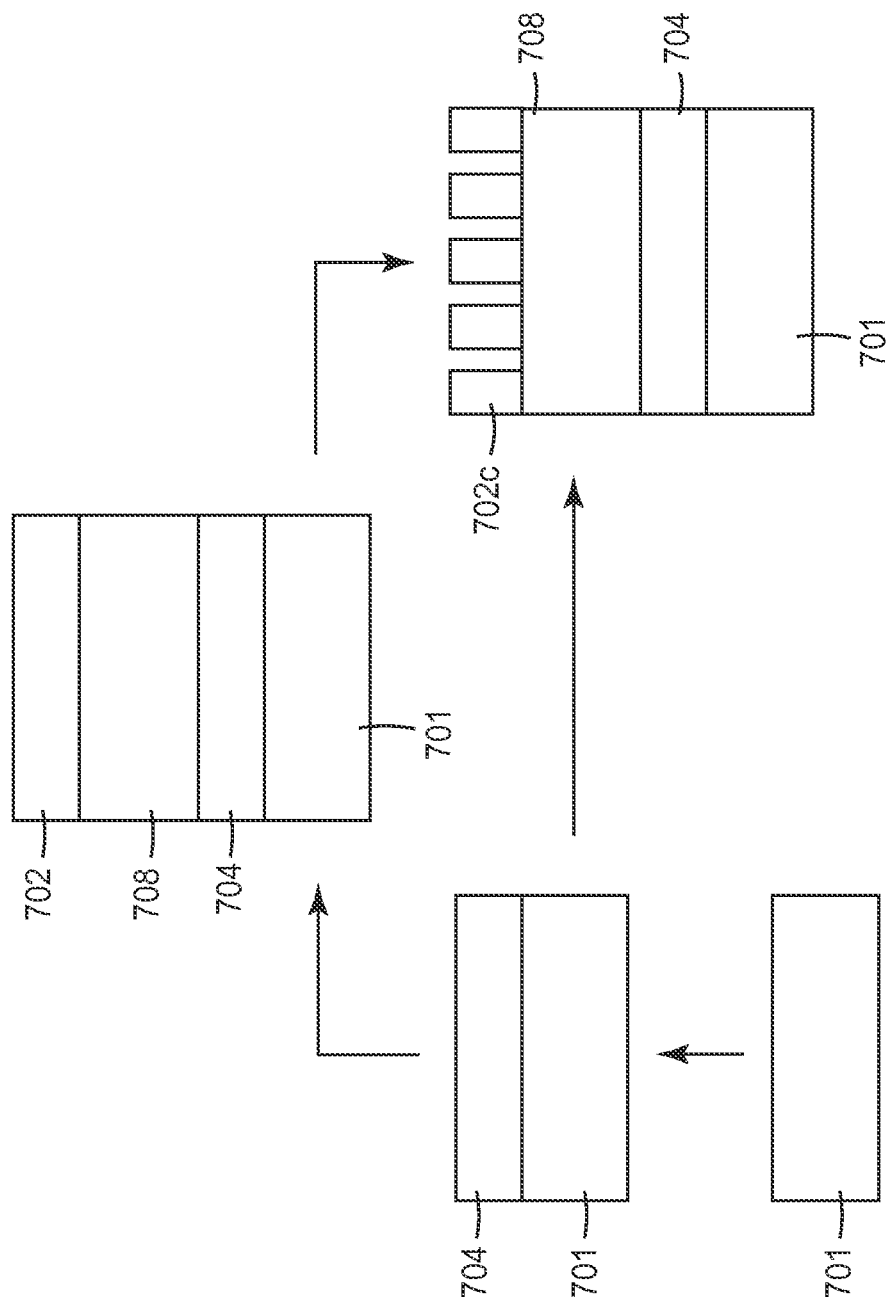
FIG. 7 is a flow chart of a method according to the present description.

FIG. 7 illustrates another method according to the present description. In this method, again a release liner is provided (701). A protective layer 704 is coated onto the release liner 701. Here, however, rather than coating the conductive layer 702 directly onto the protective layer 704, a barrier layer or barrier layer stack 708 is coated onto the protective layer. Then, the conductive layer 702 is indirectly coated onto the protective layer 704 and is directly coated onto barrier layer 708. Again, the conductive layer is patterned into patterned conductive layer 702c. Although not illustrated, the remaining steps from FIG. 6 of removing the release liner and laminating the remainder of the construction to an optically clear adhesive are also performed.

Figure 8:
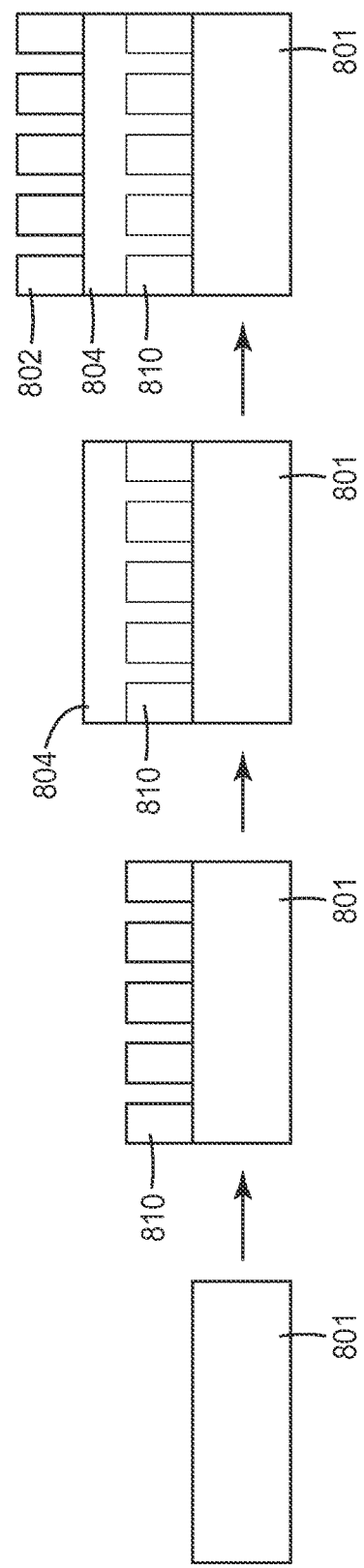
FIG. 8 is a flow chart of a method according to the present description.

FIG. 8 provides yet another method according to the present description. Here a release liner 801 is provided and protective layer 804 is ultimately applied to the release liner 801. Conductive layer 802 is coated onto the protective layer and is patterned (though the patterning step is not shown in this flowchart). As with FIG. 6, the release liner 801 may ultimately be removed and the remaining construction may be laminating to an optically clear adhesive. This method differs from those previously provided in that a second conductive patterned substrate 810 is applied onto the release liner 801 before the protective layer is applied to the release liner. This results in the protective layer 804 covering both the second conductive patterned substrate and those portions of the release liner that are exposed between the pattern of the second conductive layer.

Figure 9:
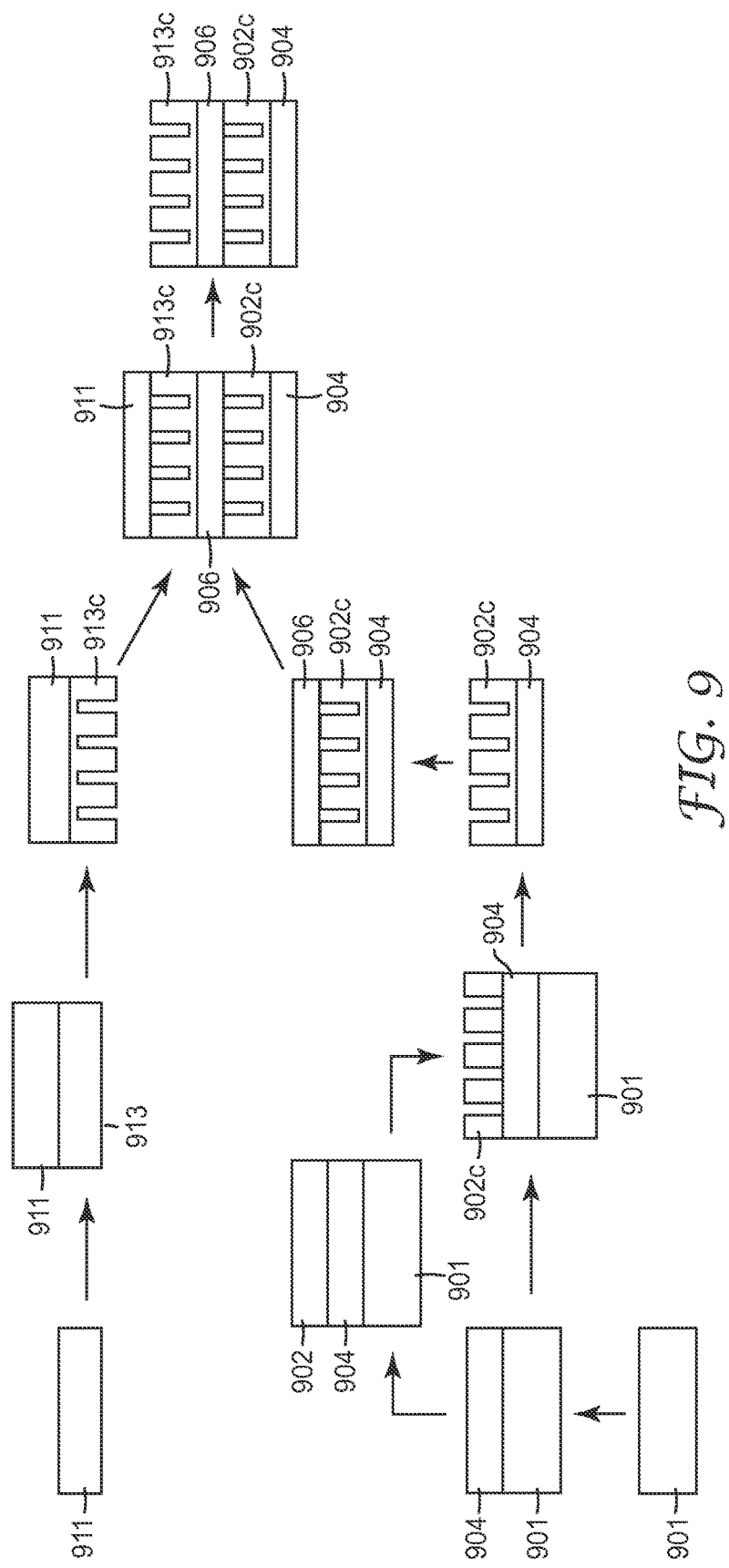
FIG. 9 is a flow chart of a method according to the present description.

FIG. 9 illustrates yet another flow chart of a method according to the present description. The method includes providing a release liner 901, coating a protective layer 904 onto the release liner 901 and coating a conductive layer 902 onto the protective layer. The conductive layer 902 is patterned (see patterned substrate 902c), the release liner 901 is removed, and the remaining construction (here the patterned conductive layer and optically clear adhesive layer) are laminated to optically clear adhesive 906.

The method further includes providing a second release liner 911. A second conductive layer 913 is coated onto the second release liner. The second conductive layer is patterned to create a patterned second conductive layer (illustrated for clarity as 913c). Next, the second conductive layer 913c is laminated to the opposite side of the optically clear adhesive 906 from the conductive layer 902c. Finally, the second release liner 911 can be removed. The result is a thin construction with corresponding touch sensor electrodes on opposing sides of an optically clear adhesive, with a protective layer that may act as a front surface of the touch sensor.

Embodiments disclosed herein include the following items:

Item 1. A construction, comprising:
a first patterned conductive layer comprising rows of conductor extending in a first direction, the first patterned conductive layer capable of being transferred from a sacrificial release liner;
an optically clear adhesive positioned on the patterned conductive layer; and
a protective layer that is positioned on the opposite side of the first patterned conductive layer from the optically clear adhesive.

Item 2. The construction of item 1, wherein the protective layer comprises a hardcoat.

Item 3. The construction of item 1, wherein the hardcoat comprises an alkoxylated multi (meth)acrylate monomer upon which the sacrificial release liner is capable of being attached.

Item 4. The construction of item 1, wherein the protective layer comprises a non-glass material.

Item 5. The construction of item 1, further comprising a barrier layer positioned between the protective layer and first patterned conductive layer.

Item 6. The construction of item 1, further comprising a second patterned conductive layer positioned on the opposite side of the optically clear adhesive from the first patterned conductive layer, the second patterned conductive layer comprising rows of conductor extending in a second direction that is orthogonal to the first direction but in a parallel plane to the first direction.

Item 7. The construction of item 6, wherein the second patterned conductive layer is at least partially embedded within a second protective layer.

Item 8. The construction of item 1, further comprising a glass receptor substrate upon which the opposite side of the optically clear adhesive from the first patterned conductive layer is adhered.

Item 9. The construction of item 1, wherein the first pattered conductive layer comprises patterned indium tin oxide.

Item 10. The construction of item 1, wherein the first patterned conductive layer comprises silver nanowire.

Item 11. The construction of item 1, wherein the first patterned conductive layer comprises metal mesh.

Item 12. The construction of item 1, wherein the first patterned conductive layer comprises carbon nanotubes or graphene.

Item 13. The construction of item 1, further comprising interconnects that connect to the first patterned conductive layer.

Item 14. The construction of item 13, wherein the interconnects comprise aluminum, copper, silver, gold, palladium, carbon, or nickel alloys.

Item 15. The construction of item 14, wherein the interconnects comprise silver and the first patterned conductive layer comprises graphene.

Item 16. The construction of item 1, wherein the thickness of the construction is less than 150 microns.

Item 17. A construction, comprising:
a first patterned conductive layer comprising rows of conductor extending in a first direction, the first patterned conductive layer capable of being transferred from a sacrificial release liner;
an optically clear adhesive positioned on the first patterned conductive layer; and
a second patterned conductive layer positioned on the opposite side of the optically clear adhesive from the first patterned conductive layer, the second patterned conductive layer comprising rows of conductor extending in a second direction that is orthogonal to the first direction but in a parallel plane as the first direction, and the second patterned conductive layer being capable of being transferred to the optically clear adhesive by a sacrificial release liner.

Item 18. A method, comprising:
providing a release liner,
coating a protective layer onto the release liner,
coating a conductive layer onto the protective layer,
patterning the conductive layer,
removing the release liner, and
laminating the protective layer and patterned conductive layer to an optically clear adhesive layer.

Item 19. The method of item 18, where the protective layer is coated onto the release liner using a wet coating process.

Item 20. The method of item 18, wherein the conductive layer is coated onto the protective layer using a vacuum coating process.

Item 21. The method of item 18, wherein the conductive layer comprises indium tin oxide.

Item 22. The method of item 21, wherein the indium tin oxide is patterned using an etching process.

Item 23. The method of item 18, wherein the conductive layer comprises silver.

Item 24. The method of item 23, wherein the silver is patterned using a micropatterning process.

Item 25. The method of item 18, wherein the conductive layer comprises metal mesh, carbon nanotubes or graphene.

Item 26. The method of item 18, wherein the protective layer and patterned conductive layer are laminated to the optically clear adhesive before removing the release liner.

Item 27. The method of item 18, wherein the steps are performed sequentially.

Item 28. The method of item 18, wherein the conductive layer is not coated directly onto the protective layer, but includes a further step of coating a first surface of a barrier layer onto the protective layer, and then coating the conductive layer on a second surface of the barrier layer opposite the first surface.

Item 29. The method of item 18, further comprising applying an antireflective coating or film to the surface of the protective layer opposite the patterned conductor, or etching the surface to create antireflective properties.

Item 30. The method of item 18, further comprising applying a second conductive patterned substrate onto the release liner before the protective layer is applied to the release liner, such that the protective layer covers both the second conductive patterned substrate and those portions of the release liner that are exposed between the pattern of the second conductive layer.

Item 31. The method of item 18, further comprising:
providing a second release liner;
coating a second conductive layer onto the release liner;
patterning the second conductive layer;
laminating the second conductive layer to the opposite side of the optically clear adhesive from the conductive layer; and
removing the second release liner.

Item 32. The method of item 31, wherein the steps are performed sequentially.

Item 33. A touch sensor comprising:
first and second patterned conductive layers, each capable of being transferred from a sacrificial release layer; and
an optically clear layer disposed between and adhered to the first and second patterned conductive layers, the touch sensor configured to determine a location of a force applied to the touch sensor and at least one of a magnitude and a direction of the applied force.

Item 34. The touch sensor of item 33, wherein the location of the applied force is determined by a change in a capacitive coupling between the first and second patterned conductive layers.

Item 35. The touch sensor of item 33, wherein the at least one of the magnitude and the direction of the applied force is determined by a deformation of the optically clear layer.

Item 36. The touch sensor of item 33, wherein the first and second patterned conductive layers are transferred from the sacrificial release liner.

Item 37. The touch sensor of item 36, wherein one of the first or second patterned conductive layers is transferred to a polarizer.

Item 38. The touch sensor of item 37, wherein the polarizer is glass or multilayer polymeric optical film.

Item 39. The touch sensor of item 33, wherein the optically clear layer is anisotropic.

Item 40. The touch sensor of item 33, wherein the optically clear layer is deformable.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A construction, comprising:
a first patterned conductive layer comprising rows of conductor extending in a first direction, the first patterned conductive layer capable of being transferred from a sacrificial release liner;
an optically clear adhesive positioned on the first patterned conductive layer; and
a protective layer that is positioned on the opposite side of the first patterned conductive layer from the optically clear adhesive,
wherein the protective layer comprises a hardcoat, the hardcoat comprising an alkoxylated multi (meth)acrylate monomer upon which the sacrificial release liner is capable of being attached.

2. The construction of claim 1, further comprising a second patterned conductive layer positioned on the opposite side of the optically clear adhesive from the first patterned conductive layer, the second patterned conductive layer comprising rows of conductor extending in a second direction that is orthogonal to the first direction but in a parallel plane to the first direction.

3. The construction of claim 2, wherein the second patterned conductive layer is at least partially embedded within a second protective layer.

4. The construction of claim 1, further comprising a glass receptor substrate upon which the opposite side of the optically clear adhesive from the first patterned conductive layer is adhered.

5. The construction of claim 1, wherein the first patterned conductive layer comprises patterned indium tin oxide.

6. The construction of claim 1, wherein the first patterned conductive layer comprises silver nanowire.

7. The construction of claim 1, wherein the first patterned conductive layer comprises metal mesh.

8. The construction of claim 1, wherein the first patterned conductive layer comprises carbon nanotubes or graphene.

9. The construction of claim 1, further comprising interconnects that connect to the first patterned conductive layer.

10. A construction, comprising:
a first patterned conductive layer comprising rows of conductor extending in a first direction, the first patterned conductive layer capable of being transferred from a sacrificial release liner;
an optically clear adhesive positioned on the first patterned conductive layer; and
a second patterned conductive layer positioned on the opposite side of the optically clear adhesive from the first patterned conductive layer, the second patterned conductive layer comprising rows of conductor extending in a second direction that is orthogonal to the first direction but in a parallel plane as the first direction, and the second patterned conductive layer being capable of being transferred to the optically clear adhesive by a sacrificial release liner.

11. A touch sensor comprising:
first and second patterned conductive layers, each capable of being transferred from a sacrificial release layer; and
an optically clear layer disposed between and adhered to the first and second patterned conductive layers, the touch sensor configured to determine a location of a force applied to the touch sensor and at least one of a magnitude and a direction of the applied force.

12. The touch sensor of claim 11, wherein the location of the applied force is determined by a change in a capacitive coupling between the first and second patterned conductive layers.

13. The touch sensor of claim 11, wherein the at least one of the magnitude and the direction of the applied force is determined by a deformation of the optically clear layer.

14. The touch sensor of claim 11, wherein the first and second patterned conductive layers are transferred from the sacrificial release liner.

15. A method, comprising:
providing a release liner,
coating a protective layer onto the release liner,
coating a conductive layer onto the protective layer,
patterning the conductive layer,
removing the release liner,
laminating the protective layer and patterned conductive layer to an optically clear adhesive layer, and
applying a conductive patterned substrate onto the release liner before the protective layer is applied to the release liner, such that the protective layer covers both the conductive patterned substrate and those portions of the release liner that are exposed between a pattern of the conductive patterned substrate.

16. The method of claim 15, wherein the conductive layer is not coated directly onto the protective layer, but includes a further step of coating a first surface of a barrier layer onto the protective layer, and then coating the conductive layer on a second surface of the barrier layer opposite the first surface.

17. A method, comprising:
providing a first release liner,
coating a protective layer onto the first release liner,
coating a first conductive layer onto the protective layer,
patterning the first conductive layer,
removing the first release liner,
laminating the protective layer and patterned first conductive layer to an optically clear adhesive layer,
providing a second release liner;
coating a second conductive layer onto the second release liner;
patterning the second conductive layer;
laminating the patterned second conductive layer to the opposite side of the optically clear adhesive from the first conductive layer; and
removing the second release liner.

18. The construction of claim 1, further comprising a barrier layer positioned between the protective layer and the first patterned conductive layer.

19. The method of claim 15, wherein the conductive layer comprises metal mesh, carbon nanotubes or graphene.

20. The method of claim 15, wherein the conductive layer comprises indium tin oxide or silver.

* * * * *